US006562190B1

(12) United States Patent
Kuthi et al.

(10) Patent No.: US 6,562,190 B1
(45) Date of Patent: May 13, 2003

(54) SYSTEM, APPARATUS, AND METHOD FOR PROCESSING WAFER USING SINGLE FREQUENCY RF POWER IN PLASMA PROCESSING CHAMBER

(75) Inventors: Andras Kuthi, Thousand Oaks, CA (US); Andreas Fischer, Oakland, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 09/685,051

(22) Filed: Oct. 6, 2000

(51) Int. Cl.$^7$ .......................... H05H 1/00; H01L 21/00
(52) U.S. Cl. ...................... 156/345.44; 204/298.34
(58) Field of Search ................. 156/345.43, 345.44, 156/345.48; 118/723 E, 723 R; 204/298.34

(56) References Cited

U.S. PATENT DOCUMENTS

| | | | | |
|---|---|---|---|---|
| 4,585,516 A | * | 4/1986 | Corn et al. ................. | 156/345 |
| 4,808,258 A | * | 2/1989 | Otsubo et al. .............. | 156/345 |
| 4,863,549 A | * | 9/1989 | Grunwald .................. | 156/345 |
| 5,562,952 A | | 10/1996 | Nakahigashi et al. ....... | 427/534 |
| 6,089,181 A | | 7/2000 | Suemasa et al. ............ | 118/723 |
| 6,129,806 A | * | 10/2000 | Kaji et al. .................. | 156/345 |

* cited by examiner

*Primary Examiner*—Thi Dang
(74) *Attorney, Agent, or Firm*—Martine & Penilla, LLP

(57) ABSTRACT

The present invention provides a system, apparatus, and method for processing a wafer using a single frequency RF power in a plasma processing chamber. The plasma processing system includes a modulated RF power generator, a plasma processing chamber, and a match network. The modulated RF power generator is arranged to generate a modulated RF power. The plasma processing chamber is arranged to receive the modulated RF power for processing the wafer and is characterized by an internal impedance during the plasma processing. The plasma processing chamber includes an electrostatic chuck for holding the wafer in place with the electrostatic chuck including a first electrode disposed under the wafer for receiving the modulated RF power. The plasma processing chamber further includes a second electrode disposed over the wafer. The modulated RF power generates plasma and ion bombardment energy for processing the wafer. The match network is coupled between the modulated RF power generator and the plasma processing chamber to receive and transmit the modulated RF power from the modulated RF power generator to the plasma processing chamber. The match network is further configured to match an impedance of the modulated RF power generator to the internal impedance of the plasma processing chamber.

16 Claims, 9 Drawing Sheets

SYSTEM, APPARATUS, AND METHOD FOR PROCESSING WAFER USING SINGLE FREQUENCY RF POWER IN PLASMA PROCESSING CHAMBER

BACKGROUND OF THE INVENTION

1. Field of the Invention

The present invention relates to the manufacture of semiconductor devices. More specifically, the present invention relates to plasma processing systems that employ RF power to process semiconductor wafers.

2. Description of the Related Art

Semiconductor processing systems are used to process semiconductor wafers for fabrication of integrated circuits. In particular, plasma-based semiconductor processes are commonly used in etching, oxidation, chemical vapor deposition (CVD), etc. The plasma-based semiconductor processes are typically carried out by means of plasma processing systems that include parallel plate reactors in a plasma processing chamber to provide a controlled setting. In such plasma processing systems, the parallel plate reactors typically employ two different RF frequencies for generating sufficient plasma density for anisotropic etching and ion bombardment energy for isotropic etching.

FIG. 1 illustrates a conventional plasma processing system 100 that uses two different RF frequencies for processing a semiconductor wafer 102. The plasma processing system 100 includes a plasma processing chamber 104, a pair of match networks 106 and 108, and a pair of RF generators 110 and 112. The plasma processing chamber 104 includes an electrostatic chuck 114 and a shower head 120. The shower head 120 includes an upper electrode 122 and is adapted to release a source gas into the chamber 104 for generating plasma over the wafer 102. The electrostatic chuck 114 includes a lower electrode 124 and functions to hold the wafer 102 in place for processing. A gas 126 such as helium is provided through a port 128 to control the temperature of the wafer 102. The plasma processing system 100 may also include an electrostatic chuck power supply (not shown) for supplying power to the chuck 114. Electrostatic chucks are well known in the art and are amply described, for example, in commonly owned U.S. Pat. No. 5,789,904 by Francois Guyot and entitled "High Power Electrostatic Chuck Contact," U.S. patent application Ser. No. 08/624,988 by Jones et al. and entitled "Dynamic Feedback Electrostatic Wafer Chuck," U.S. patent application Ser. No. 08/550,510 by Castro et al., and U.S. Pat. No. 5,793,192 by Kubly et al. and entitled "Methods and Apparatus for Clamping and Declamping a Semiconductor Wafer in a Wafer Processing System." The disclosures of these references are incorporated herein by reference.

The RF generators 110 and 112 are typically arranged to generate a high frequency RF power and a low frequency RF power, respectively, for delivery to the lower electrode 124 in the electrostatic chuck 114. The high frequency RF power from the RF generator 110 is mostly used to generate plasma (i.e., plasma density) in the space between the shower head 122 and the wafer 102. On the other hand, the low frequency RF power from the RF generator 112 predominantly controls the generation of ion bombardment energy for anisotropic or directional etching of the wafer 102. However, these two frequencies do not act independently on the plasma; instead, each frequency generates plasma and contributes to the ion bombardment energy as well.

The RF matching networks 106 and 108 are coupled to deliver RF power from the RF generators 110 and 112, respectively, to the electrostatic chuck 114. Generally, the match networks 106 and 108 are coupled to the RF generators 110 and 112, respectively, by means of co-axial cables 116 and 118, respectively. The RF matching networks 106 and 108 are provided between the RF generators 110 and 112, respectively, and the plasma processing chamber 104 to minimize reflection of RF power from the plasma processing chamber 104. The RF matching network 110 typically includes one or more variable impedance elements (e.g., capacitors, inductors). The variable impedance elements in the RF matching networks 106 and 108 may be tuned to provide impedance that matches the impedance of the RF generators 110 and 112, respectively. RF match network circuits are well known in the art and are described, for example, in U.S. patent application Ser. No. 5,187,454 by Collins et al. and U.S. patent application Ser. No. 09/218,542 by Arthur M. Howald and filed on Dec. 22 1998. The disclosures of these references are incorporated herein by reference.

The use of both high and low frequency RF power from the RF generators 110 and 112 is designed to ensure adequate supply of plasma and ion bombardment energy. Specifically, when the RF generators 110 and 112 are energized after a source gas 130 has been introduced into the chamber 104, the high and low frequency powers from the RF generators 110 and 112 facilitate generation of plasma 132 and ion bombardment energy for processing the wafer 102. The high frequency RF power, typically in the range between 4 MHz to 60 MHz, from the RF generator 110 largely facilitates generation of plasma 132 from the source gas. On the other hand, the low frequency RF power from the RF generator 112, typically in the range between 100 KHz and 4 MHz, largely facilitates ion bombardment against the wafer 102 by increasing the ion bombardment energy.

When RF powers are applied, bias voltages often called "sheath voltages" are generated near the electrodes 122 and 124. FIG. 2A shows a schematic diagram of plasma sheaths 202 and 204 generated near the surface of the electrodes 122 and 124, respectively. In this configuration, the sheath voltages which drop across the sheaths 202 and 204 correspond to the floating potential of the plasma and are about four to five times the plasma electron temperature in the absence of RF power. When the low and high frequency RF powers are applied, the RF current i flows from the lower electrode 124 to the upper electrode 122. The sheath voltages rise close to the peak RF potential. As a result, the sheaths expand and the average voltage drops between the plasma and electrodes 122 and 124 increase. The increase in the voltage drops, in turn, causes increase in ion bombardment energy toward the electrodes 122 and 124.

Unfortunately, however, one of the drawbacks in using the two-frequency approach of the plasma processing system 100 is the non-uniformity in wafer etch rate associated with the low frequency RF power. In general, the use of high frequency RF power alone generates substantially uniform etch rates across the surface of a wafer. In such cases, however, the etch rate tends to be too low and the pattern profile is poorly controlled due to insufficient ion bombardment energy. The use of low frequency RF power increases the ion bombardment energy.

However, the use of low frequency RF power along with the high frequency RF power in a plasma process system tends to result in non-uniform etching over the surface of the wafer. For example, FIG. 2B illustrates a graph 200 of an etch rate as a function of distance from the center of a wafer. As shown, the etch rate of the wafer decreases as the distance from the center of the wafer increases. Thus, the etch rate near the edge of the wafer may not match the design specification, thereby resulting in a lower die yield.

In view of the foregoing, what is needed is a system and method for processing a wafer surface without using a separate low frequency RF power generator in a plasma processing system to enhance the uniformity of wafer processing results without reducing the etch rate on the wafer.

SUMMARY OF THE INVENTION

Broadly speaking, the present invention fills these needs by providing a system, apparatus, and method for processing a wafer using a single frequency RF power in a plasma processing chamber. It should be appreciated that the present invention can be implemented in numerous ways, including as a process, an apparatus, a system, a device, a method, or a computer readable medium. Several inventive embodiments of the present invention are described below.

In accordance with one embodiment, the present invention provides a plasma processing system for processing a wafer using a single frequency RF power. The plasma processing system includes a modulated RF power generator, a plasma processing chamber, and a match network. The modulated RF power generator is arranged to generate a modulated RF power (e.g., energy). The plasma processing chamber is arranged to receive the modulated RF power for processing the wafer and is characterized by an internal impedance during the plasma processing. The plasma processing chamber includes an electrostatic chuck for holding the wafer in place with the electrostatic chuck including a first electrode disposed under the wafer for receiving the modulated RF power. The plasma processing chamber further includes a second electrode disposed over the wafer. The modulated RF power generates plasma and ion bombardment energy for processing the wafer. The match network is coupled between the modulated RF power generator and the plasma processing chamber to receive and transmit the modulated RF power from the modulated RF power generator to the plasma processing chamber. The match network is further configured to match an impedance of the modulated RF power generator to the internal impedance of the plasma processing chamber.

In another embodiment, the present invention provides a plasma processing apparatus for etching a wafer. The plasma processing apparatus includes a modulated RF power generator, a plasma processing chamber, and a matching network. The modulated RF power generator is configured to generate a modulated high frequency RF power. The plasma processing chamber is arranged to receive the modulated high frequency RF power for etching the wafer. The plasma processing chamber is characterized by an impedance and includes an electrostatic chuck for holding the wafer in place. The electrostatic chuck includes a first electrode disposed under the wafer for receiving the modulated high frequency RF power. The plasma processing chamber further includes a second electrode disposed over the wafer. In response to the modulated high frequency RF power, plasma and ion bombardment energy are generated for etching the wafer. The match network is coupled between the modulated RF power generator and the plasma processing chamber to receive and transmit the modulated high frequency RF power from the modulated RF power generator to the plasma processing chamber. The match network is further configured to match the impedance of the modulated RF power generator to the impedance of the plasma processing chamber.

In yet another embodiment, a method is disclosed for processing a wafer in a plasma processing chamber using single frequency RF power. The method includes: (a) generating a single modulated RF power; (b) providing a wafer over an electrostatic chuck in a plasma processing chamber, the electrostatic chuck including a first electrode disposed under the wafer for receiving the modulated RF power, and the plasma processing chamber further including a second electrode disposed over the wafer; (c) receiving the modulated RF power, by the plasma processing chamber; and (d) generating plasma and ion bombardment energy in the plasma processing chamber for processing the wafer in response to the modulated RF power.

Preferably, the modulated RF power is a high frequency RF power including an average RF power for providing a high anisotropic etch rate, a peak RF power for providing a high ion bombardment energy, and a modulation frequency configured to decouple the etch rate from the ion bombardment energy. Advantageously, the use of the modulated RF power provides a high etch rate in conjunction with a high degree of etch profile control. Thus, the plasma processing system 400 of the present invention allows optimum processing of the wafer for both isotropic and anisotropic etching simultaneously. Further, the modulation of the high frequency RF power effectively decouples the ion flux from the ion bombardment energy, allowing more precise control of etch profiles and overall plasma density. In addition, the use of the modulated high frequency RF power allows extension of the process window of dielectric etch for enhanced plasma processing. For example, the plasma processing system allows oxide layers to be etched at and below 0.18 $\mu$m with good profile control. These and other advantages of the present invention will become apparent upon reading the following detailed descriptions and studying the various figures of the drawings.

BRIEF DESCRIPTION OF THE DRAWINGS

The present invention will be readily understood by the following detailed description in conjunction with the accompanying drawings, and like reference numerals designate like structural elements.

DETAILED DESCRIPTION OF THE PREFERRED EMBODIMENTS

An invention is described herein for a system, apparatus, and method for processing a wafer using a single frequency RF power in a plasma processing chamber. In the following description, numerous specific details are set forth in order to provide a thorough understanding of the present invention. It will be obvious, however, to one skilled in the art, that the present invention may be practiced without some or all of these specific details. In other instances, well known process steps have not been described in detail in order not to unnecessarily obscure the present invention.

The present invention provides modulated high frequency RF power to a plasma processing chamber to overcome the limitation of the conventional dual frequency systems. By modulating a single, high frequency RF amplitude, the average RF power delivered to the plasma controls the plasma density and thus the ion flux to the wafer. On the other hand, the RF peak power, which is determined by the modulation depth, controls the ion bombardment energy. In this manner, a single modulated RF power generator can be used to control both the plasma density and ion bombardment energy in a plasma processing chamber, thereby enhancing uniformity of wafer processing results.

Figure 1:
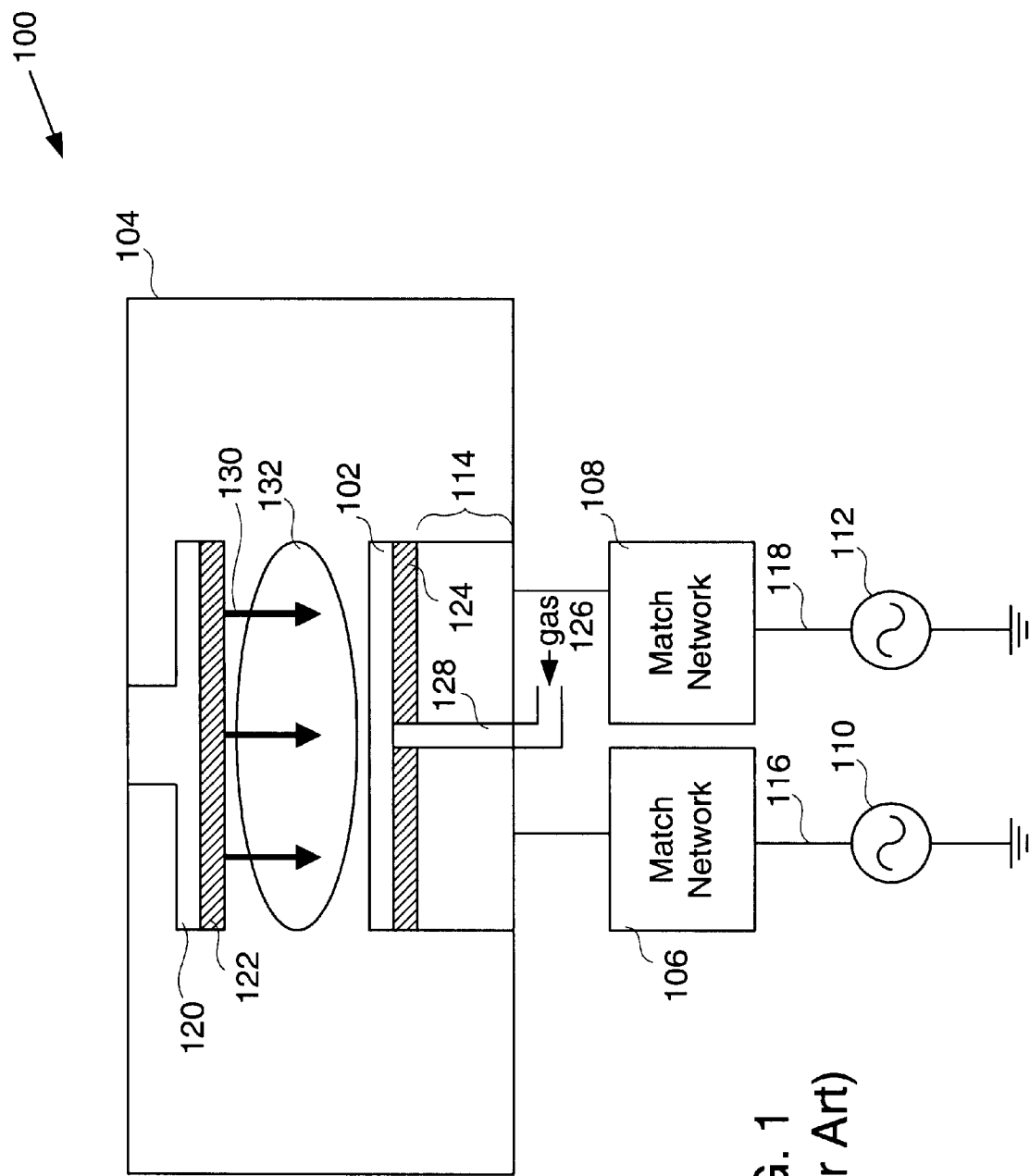
FIG. 1 illustrates a conventional plasma processing system that uses two different RF frequencies for processing a semiconductor wafer.
Figure 2A:
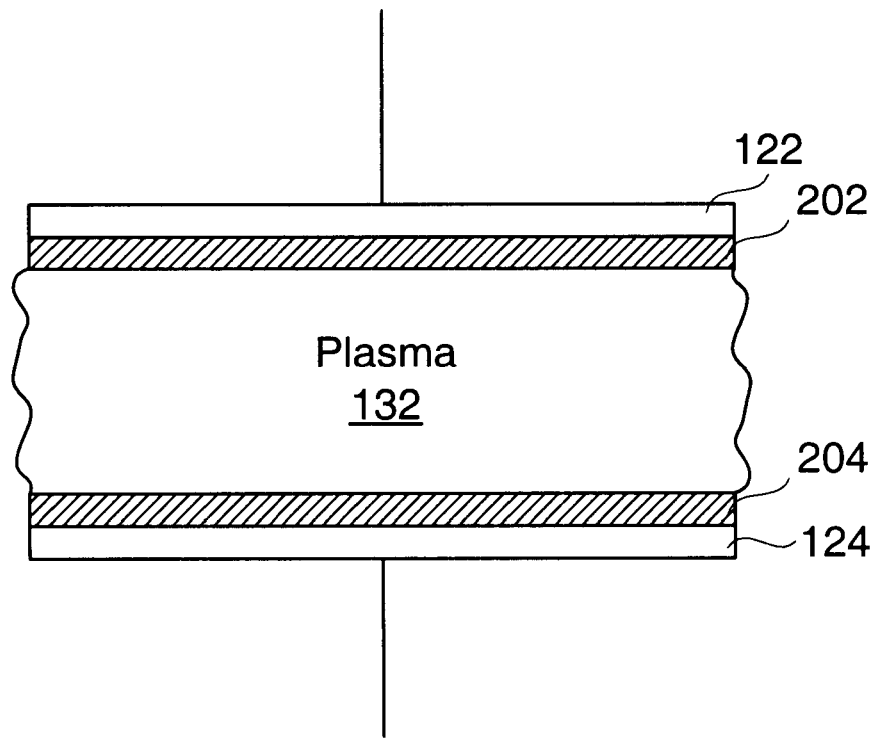
FIG. 2A shows a schematic diagram of sheath voltages generated near the surface of the electrodes on the side of plasma.
Figure 2B:
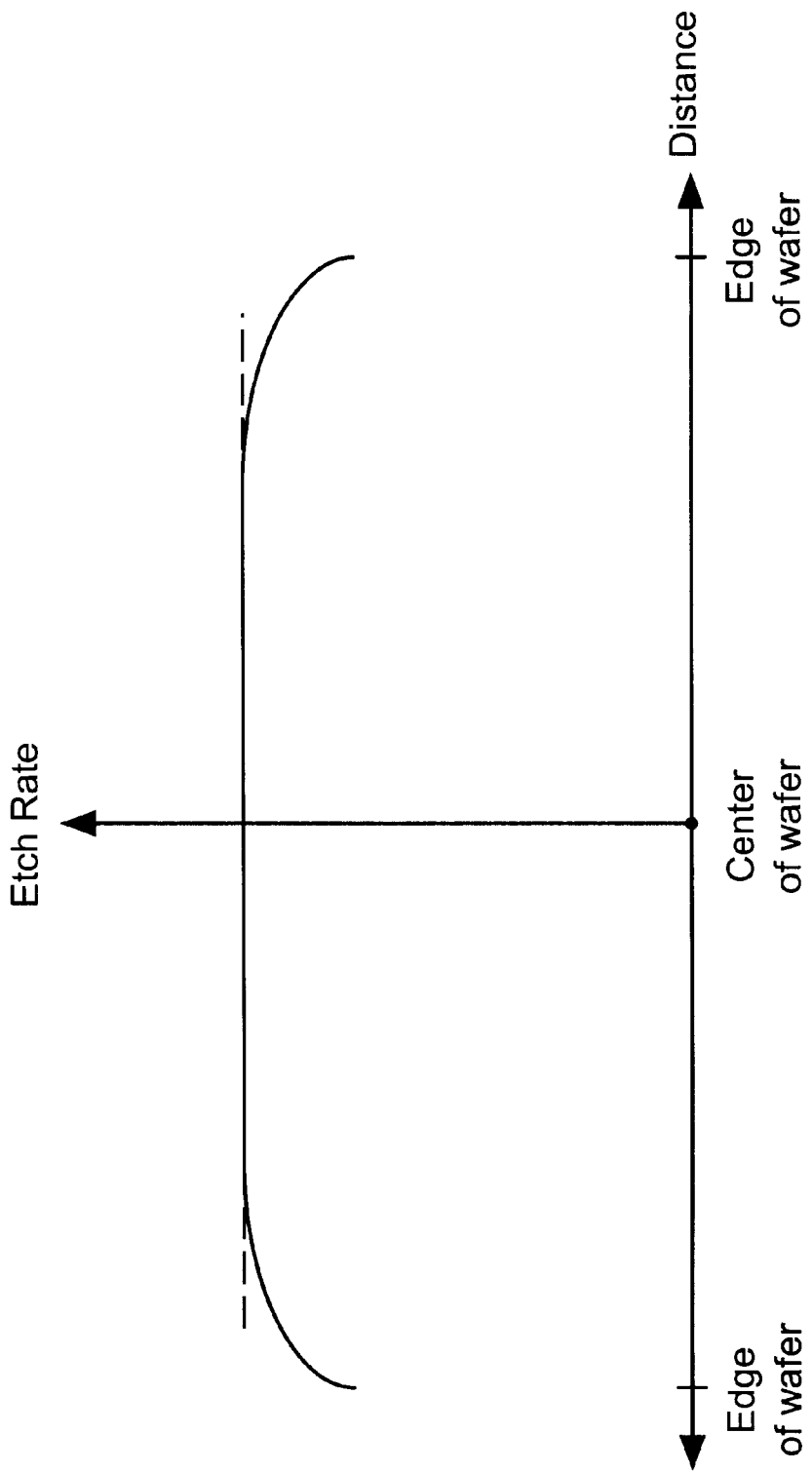
FIG. 2B illustrates a graph of an etch rate as a function of distance from the center of a wafer.
Figure 3:
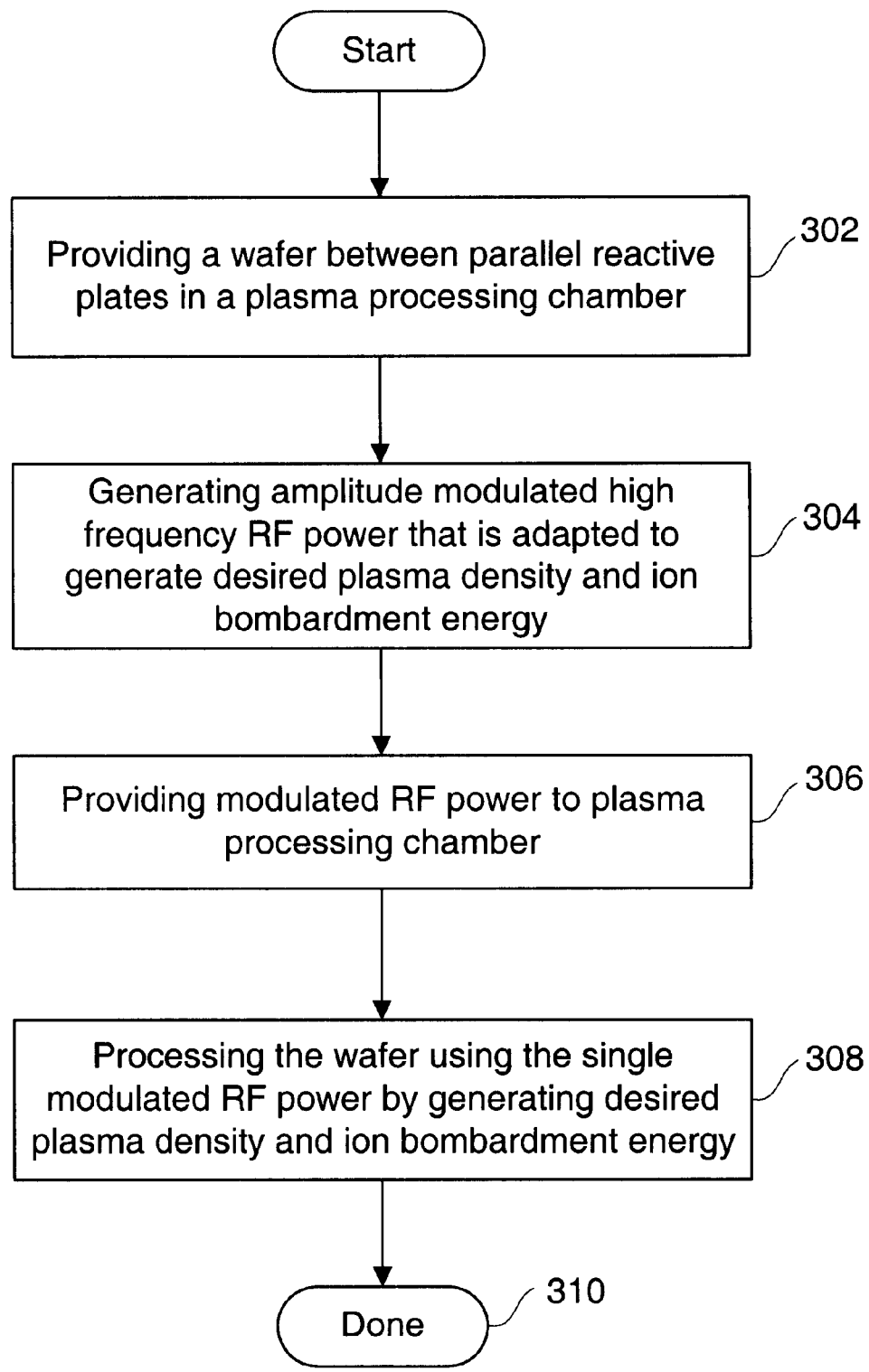
FIG. 3 shows a flowchart of an exemplary method for delivering RF power to a plasma processing chamber in accordance with one embodiment of the present invention.

FIG. 3 shows a flowchart of an exemplary method for delivering RF power to a plasma processing chamber in accordance with one embodiment of the present invention. The method provides a wafer between parallel reactive plates (e.g., electrodes) in a plasma processing chamber in operation 302. In modulating the high frequency RF power, variables such as RF average power, RF peak power, and RF power modulation frequency may be modulated to obtain optimum plasma density and ion flux. Then in operation 304, modulated high frequency RF power is generated for use in the plasma processing chamber. Preferably, the high frequency RF power is modulated to generate desired plasma density and ion bombardment energy. Then in operation 306, the modulated RF power is provided to the plasma processing chamber through a match network. In this operation, the match network receives the RF power and produces an impedance, which matches the impedance of a modulated RF power generator to the impedance of the plasma processing chamber in operation 206. In response to the modulated RF power, the wafer is processed using the modulated high frequency RF power by generating desired plasma density and ion bombardment energy in operation 308. The method then terminates in operation 310.

Figure 4:
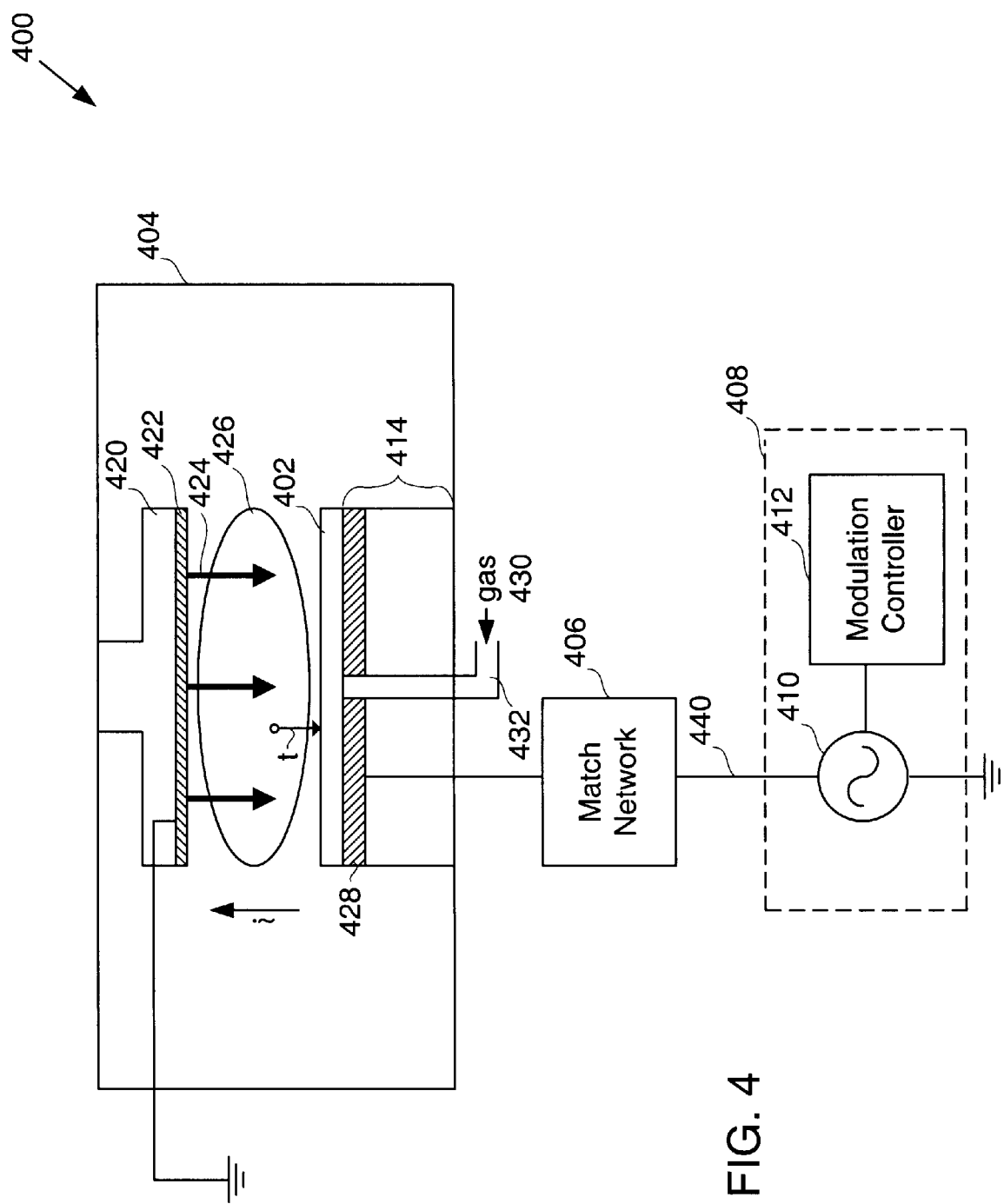
FIG. 4 illustrates an exemplary plasma processing system that employs a single modulated high frequency RF power for processing a semiconductor wafer in accordance with one embodiment of the present invention.

FIG. 4 illustrates an exemplary plasma processing system 400 that employs a single modulated high frequency RF power for processing a semiconductor wafer 402 in accordance with one embodiment of the present invention. The plasma processing system 400 includes a plasma processing chamber 404, a match network 406, and a modulated high frequency RF power generator 408. The plasma processing chamber 404 includes an electrostatic chuck 414 and a shower head 420. The shower head 420 includes an upper electrode 422, which is preferably grounded, and is arranged to release a source gas 424 into the chamber 404 for generating plasma 426 over the wafer 402. The electrostatic chuck 414 includes a lower electrode 428 and functions to hold the wafer 402 in place for processing. A gas 430 such as helium is provided through a port 432 to control the temperature of the wafer 402. The plasma processing system 400 may also include an electrostatic power supply (not shown) for supplying power to the electrostatic chuck 414.

The modulated RF power generator 408 includes a high frequency RF power generator 410 and a modulation controller 412. The high frequency RF power generator 410 is arranged to generate high frequency RF power, preferably greater than 13 MHz and more preferably in a range between 4 MHz and 60 MHz. However, it may also generate any other frequencies suitable for generating sufficient plasma density for processing a wafer. The modulation controller 412 is coupled to provide modulation signals to the high frequency RF power generator 410. In one embodiment, the modulation controller 412 provides signals to the RF power generator 410 for modulating the average RF power, peak RF power, and RF power modulation frequency. In response to the modulation signals from the modulation controller 412, the RF power generator 410 generates modulated high frequency RF power, which is fed into the match network via a coaxial cable 440.

The RF matching network 406 is coupled to deliver the RF power from the modulated RF power generator 408 to electrode 428 in the electrostatic chuck 414. The RF matching network 406 is provided between the modulated high frequency RF power generator 408 and the plasma processing chamber 404 to minimize reflection of RF power from the plasma processing chamber 404. The RF matching network 406 is well known in the art and typically includes a plurality of variable impedance elements such as capacitors, inductors, and the like. These variable impedance elements in the RF matching network 406 may be tuned to match the impedance of the modulated RF power generator 408 to the impedance of the plasma processing chamber 404. Preferably, the RF matching network 406 is configured to provide increased bandwidth to accommodate the modulated high frequency RF power from the modulated RF power generator 408.

The network match 406 transmits the modulated high frequency RF power to the plasma processing chamber 404 and a current i flows from the lower electrode 402 to the upper electrode 422 through the plasma 426. In response, the electrode 428 attracts plasma ions toward the wafer 402 for plasma processing, which may include etching, oxidation, chemical vapor deposition (CVD), or the like. The time t corresponds to ion transit time for an ion to move from the center of the plasma region to one of the electrodes 422 or 428. It should be appreciated that the plasma processing system 400 is described in detail herein to facilitate understanding of the advantages of the present invention. However, the invention itself is not limited to any particular type of wafer processing apparatus or system and may be adapted for use in any suitable wafer processing systems, including but not limited to those adapted for deposition, oxidation, etching (including dry etching, plasma etching, reactive ion etching (RIE), magnetically enhanced reactive ion etching (MERIE), electron cyclotron resonance (ECR)), or the like.

In this configuration, the modulation controller 412 sets the desired modulation parameters of the high frequency RF power to be delivered to the plasma processing chamber 404. For example, the modulation controller 412 may set the average RF power, peak RF power, and RF power modulation frequency of the RF power to be delivered. The average power of the modulated high frequency RF power delivered to the plasma 426 determines the plasma density and thus the ion flux to the wafer 402 in the plasma processing chamber 404. On the other hand, the RF peak power, which is determined by the modulation depth of the modulated high frequency RF power controls the bias voltage (i.e., sheath voltage). The RF power modulation frequency, which is distinguished from conventional frequency modulation, is chosen such that the plasma density is approximately constant between the modulation peaks and preferably greater than 100 KHz. If the electron temperature is to be constant as well, the modulation frequency is preferably increased to above 1 MHz.

The modulated high frequency RF power from the modulated RF power generator 408 simultaneously ensures adequate plasma density and ion bombardment energy in the plasma processing chamber 404. Specifically, when the modulated RF power generator 408 is energized after a source gas 130 has been introduced into the plasma processing chamber 404, the average RF power of the modulated high frequency RF power facilitates generation of high plasma density from the source gas 424. The generation of the high plasma density, in turn, allows high etch rates for anisotropic etching of the wafer 402.

On the other hand, the peak RF power of the modulated high frequency RF power increases the bias or sheath voltage on the electrode 428 to provide optimum ion bombardment energy against the wafer 402. Thus, the peak RF power of the modulated high frequency RF power facilitates isotropic or directional etching on the wafer 402. The use of the peak RF power allows a high degree of etch profile control. Thus, the plasma processing system 400 of the present invention allows optimum processing of the wafer 402 for both isotropic and anisotropic etching.

In addition, the modulation of the high frequency RF power effectively decouples the ion flux from the ion bombardment energy, allowing more precise control of etch profiles and overall plasma density. Further, the use of the modulated high frequency RF power allows extension of the process window of dielectric etch for enhanced plasma processing. In particular, the plasma processing system 400 allows oxide layers to be etched at and below 0.18 μm with good profile control.

Figure 5A:
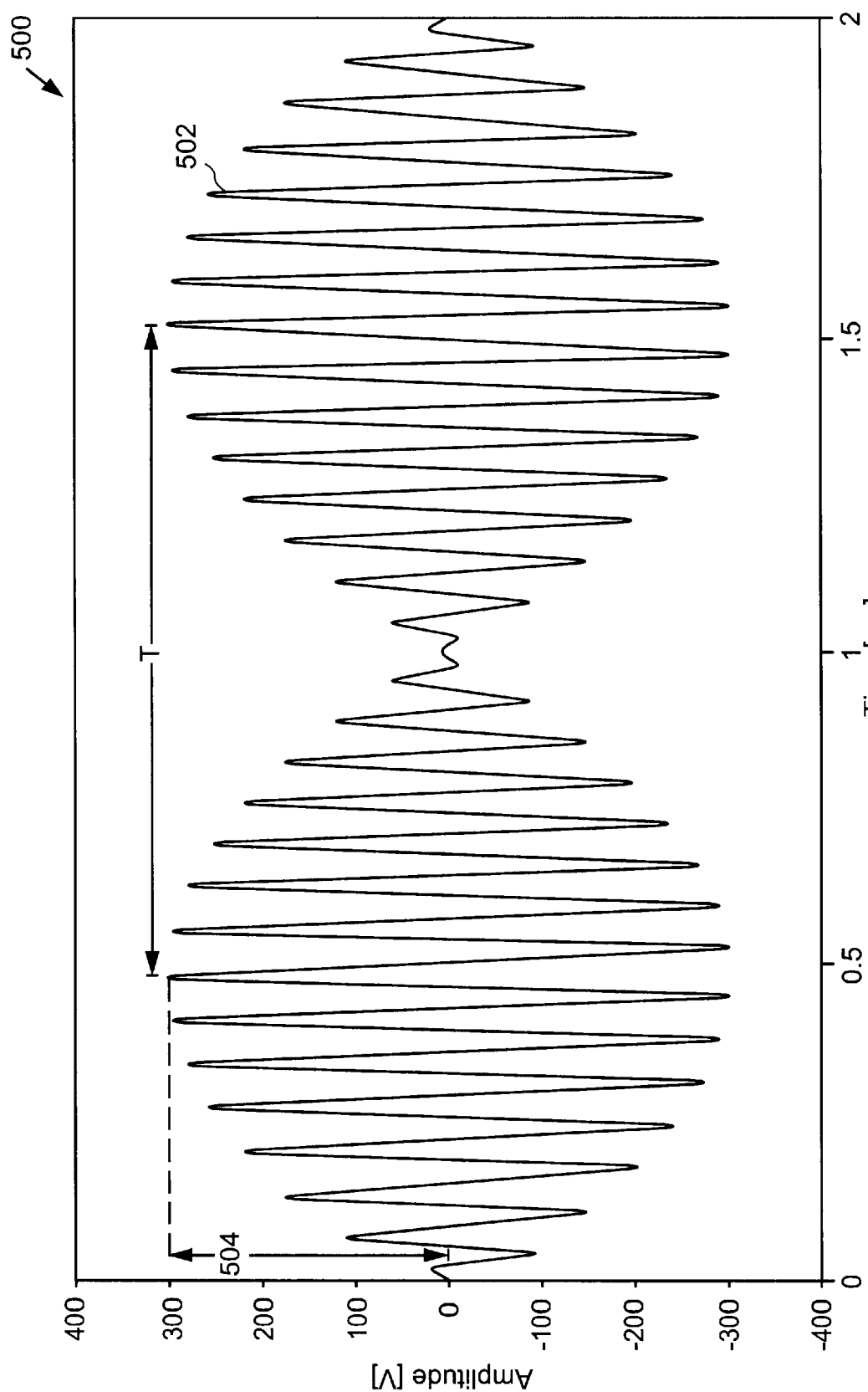
FIG. 5A illustrates a graph of a modulated high frequency RF power signal delivered to a plasma processing chamber in accordance with one embodiment of the present invention.
Figure 5B:
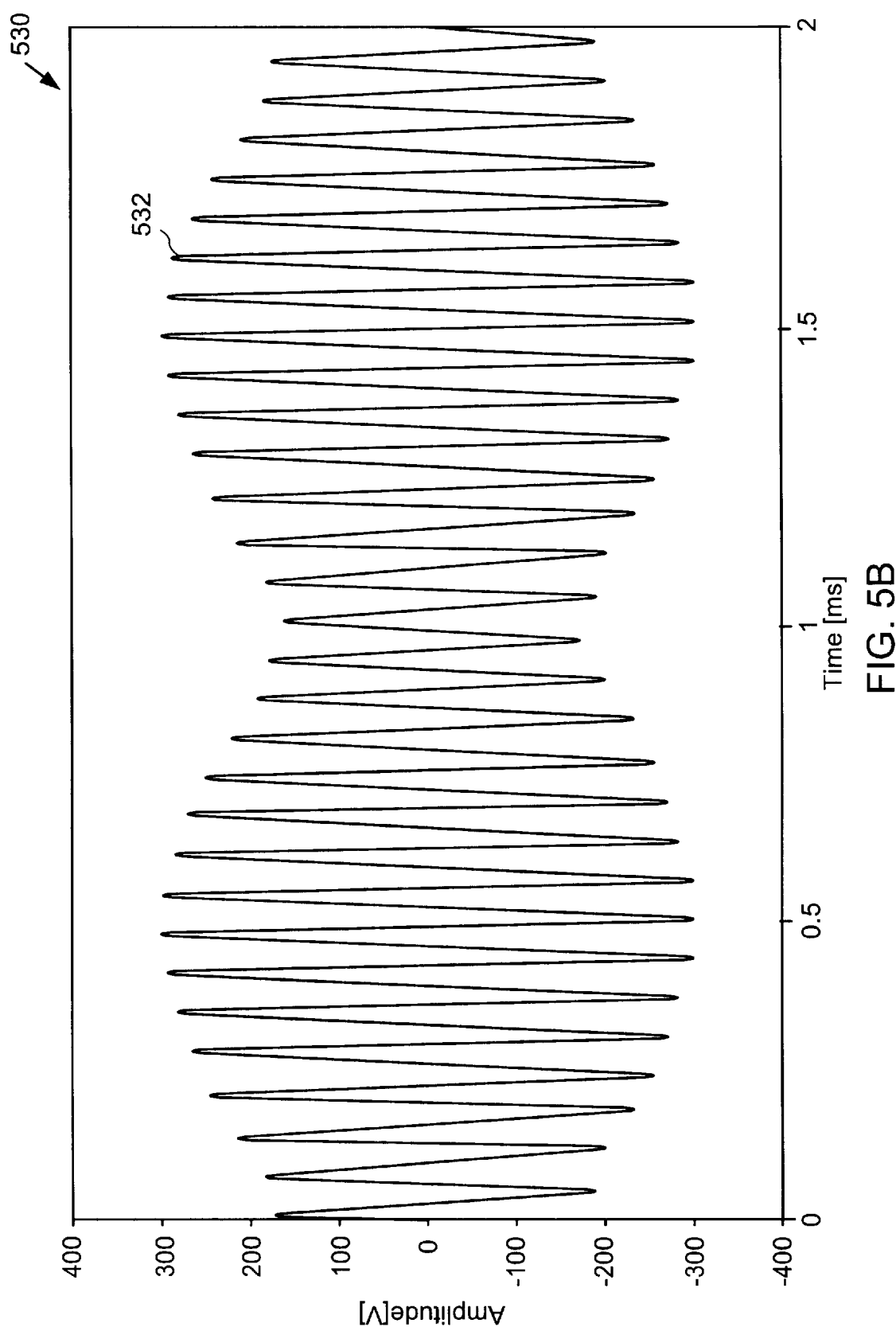
FIG. 5B shows a graph of a high frequency RF power signal with 50% sine modulation in accordance with one embodiment of the present invention.
Figure 5C:
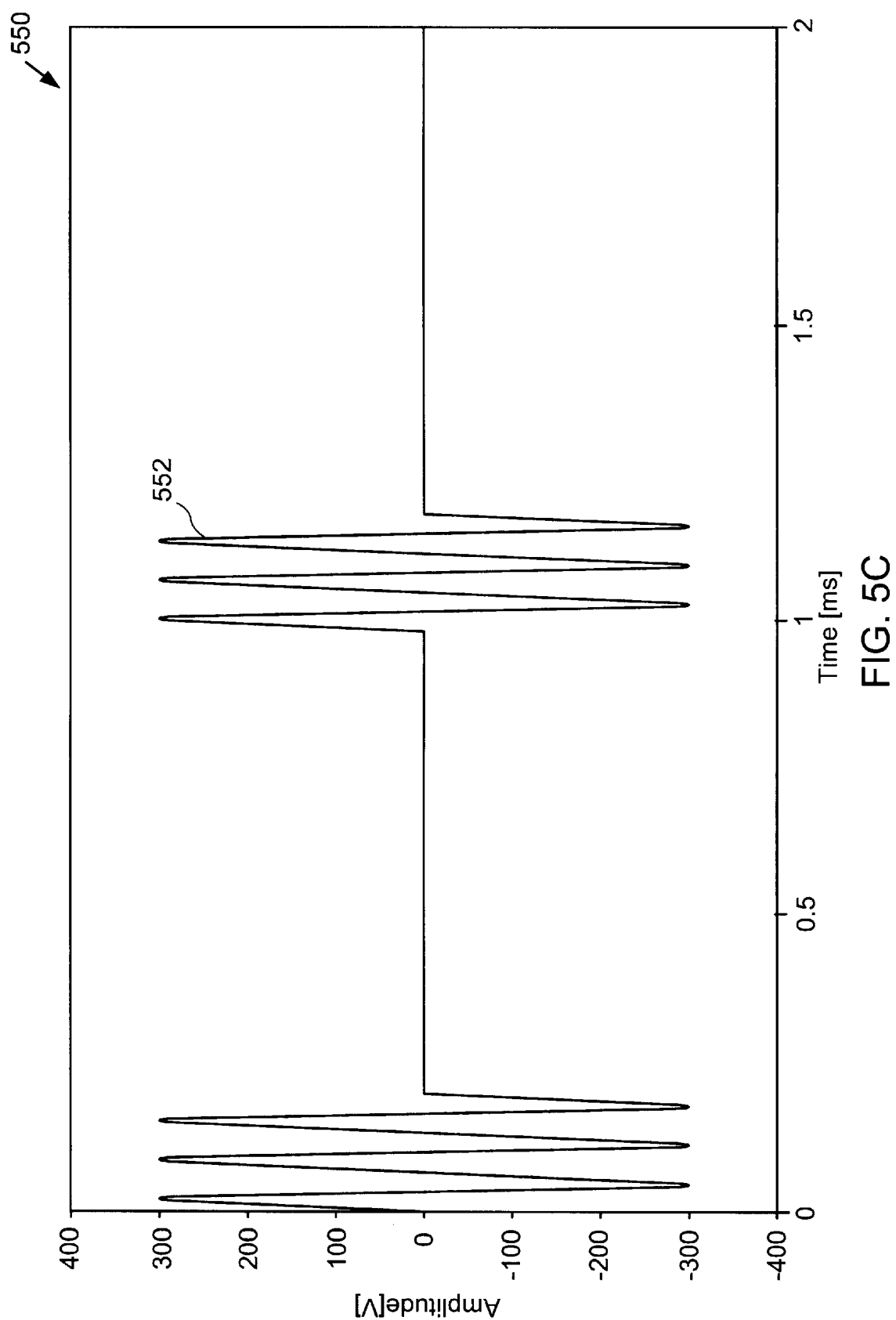
FIG. 5C shows a graph of a modulated high frequency RF power signal with 20% duty cycle in accordance with another embodiment of the present invention.

FIG. 5A illustrates a graph 500 of a modulated high frequency RF power signal 502 delivered to the plasma processing chamber 404 in accordance with one embodiment of the present invention. In this graph 500, the high frequency RF power signal 502 is a 100% modulated sine wave. Accordingly, the modulation depth 504 of the signal 502, which is defines as the distance between the peak and trough of the signal 502, is 100%. On the other hand, the modulation frequency is defined as $1(T_2-T_1)$ or $1/T$. In another embodiment, FIG. 5B shows a graph 530 of a high frequency RF power signal 532 with 50% sine modulation. Likewise, FIG. 5C shows a graph 550 of a modulated high frequency RF power signal 552 with 20% duty cycle in accordance with another embodiment of the present invention. Besides these exemplary modulated RF power signals, those skilled in the art will recognize that the present invention may employ any high frequency modulation that can provide sufficient plasma density and ion bombardment energy.

Figure 6:
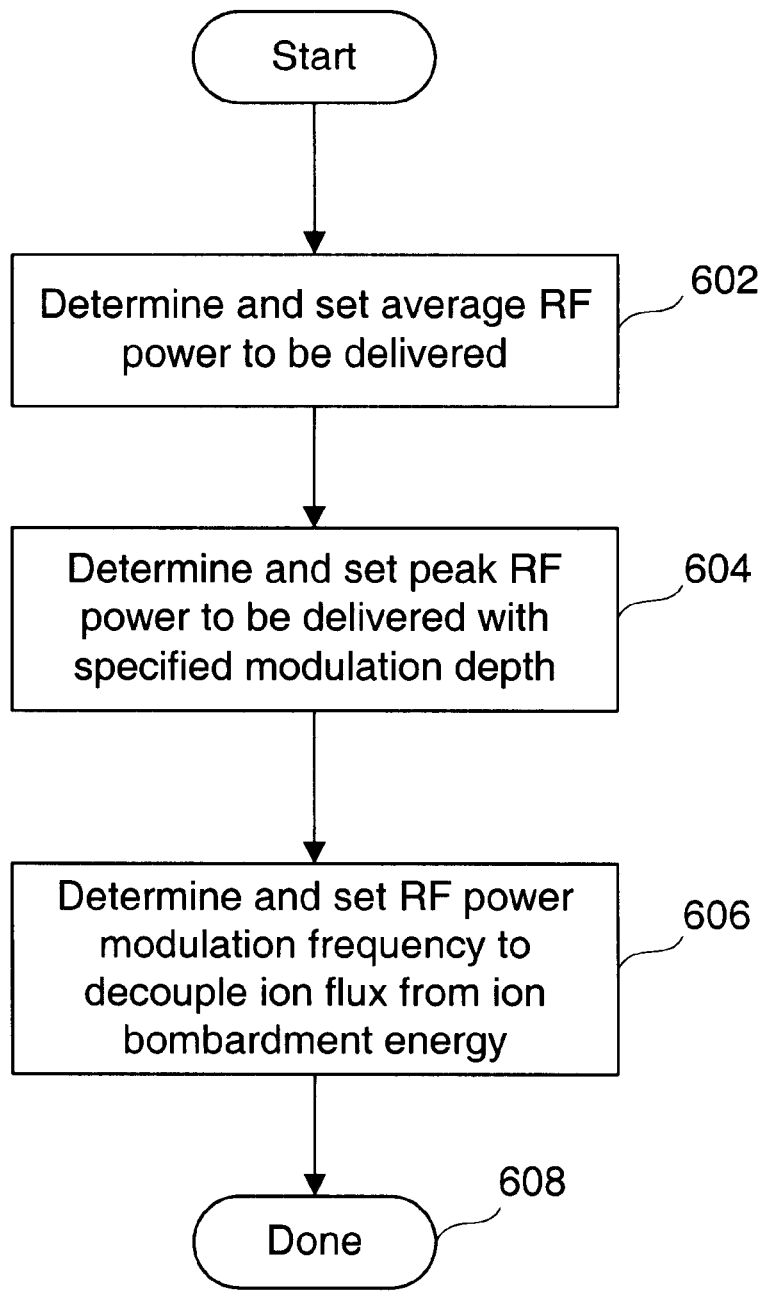
FIG. 6 shows a flowchart of a method for modulating a high frequency RF power in accordance with one embodiment of the present invention.

FIG. 6 shows a flowchart of a method for modulating a high frequency RF power in accordance with one embodiment of the present invention. The method begins in operation 602, where an average RF power to be delivered is determined and set to achieve a specified anisotropic etch rate. The average RF power in this operation is defined as the absolute magnitude of RF power to be delivered to plasma. Once the average RF power is thus set, the plasma density will remain constant throughout plasma processing.

To increase the sheath voltage and thus ion bombardment energy, a peak RF power (e.g., amplitude) to be delivered is determined and set to achieve a specified anisotropic etch profile in operation 604. In one embodiment, the peak RF power may be defined in terms of modulation depth described in FIG. 5A. To decouple the ion flux from the ion bombardment energy, an RF power modulation frequency as shown in FIG. 5A may be determined and set in operation 606. This modulation frequency allows the ion flux and ion bombardment energy to be independently controlled. Preferably, the modulation frequency is sufficiently high so that the ion transit time from the center of the plasma region to an electrode is greater than the modulation frequency. This ensures that the plasma density will remain substantially constant. It should be noted that the average RF power, peak RF power, and modulation frequency may be set either manually or automatically in the modulation controller 412. The method then terminates in operation 608.

While this invention has been described in terms of several preferred embodiments, there are alterations, permutations, and equivalents which fall within the scope of this invention. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. A plasma processing system for processing a wafer using single frequency RF power, comprising:

a modulated RF power generator configured to generate a modulated RF power, the modulated RF power generator includes,
   a modulation controller having circuitry for varying modulation depth of the modulated RF power without amplitude modulation circuitry, and
   an RF generator coupled to receive control from the modulation controller;

a plasma processing chamber arranged to receive the modulated RF power for processing the wafer, the plasma processing chamber being characterized by an internal impedance during the plasma processing, the plasma processing chamber including an electrostatic chuck for holding the wafer in place, the electrostatic chuck including a first electrode disposed under the wafer for directly receiving the modulated RF power, and the plasma processing chamber further including a second electrode that is grounded and disposed over the wafer, wherein the plasma and ion bombardment energy are generated for processing the wafer in response to the modulated RF power; and a match network coupled between the modulated RF power generator and the plasma processing chamber to receive and transmit the modulated RF power from the modulated RF power generator to the plasma processing chamber, the match network being further configured to match an impedance of the modulated RF power generator to the internal impedance of the plasma processing chamber.

2. The system as recited in claim 1, wherein modulated RF power is a modulated high frequency RF power adapted to produce a specified etch rate on the wafer for an anisotropic etching.

3. The system as recited in claim 2, wherein the modulated high frequency RF power includes an average RF power and a peak RF power.

4. The system as recited in claim 3, wherein the plasma processing chamber maintains a constant plasma density in response to the average RF power of the modulated high frequency RF power.

5. The system as recited in claim 3, wherein the peak RF power is adapted to increase the ion bombardment energy in the plasma processing chamber for isotropic processing of the wafer.

6. The system as recited in claim 2, wherein the modulated high frequency RF power includes a modulation frequency adapted to decouple the etch rate from the ion bombardment energy.

7. The system as recited in claim 6, wherein the modulation frequency of the modulated high frequency RF power is greater than the time for an ion to travel from a center region of the plasma to one of the electrodes.

8. The system as recited in claim 6, wherein the frequency of the modulated RF power is greater than 4 MHz.

9. A plasma processing apparatus for etching a wafer, comprising:
   a modulated RF power generator configured to generate a modulated high frequency RF power, the modulated RF power generator includes,
      a modulation controller including circuitry for varying modulation depth of the modulated high frequency RF power, and
      an RF generator coupled to receive control from the modulation controller;
   a plasma processing chamber arranged to receive the modulated high frequency RF power for etching the wafer, the plasma processing chamber being characterized by an impedance, the plasma processing chamber including an electrostatic chuck for holding the wafer in place, the electrostatic chuck including a first electrode disposed under the wafer for directly receiving the modulated high frequency RF power, and the plasma processing chamber further including a second electrode that is grounded and disposed over the wafer, wherein plasma and ion bombardment energy are generated for etching the wafer in response to the modulated high frequency RF power; and
   a match network coupled between the modulated RF power generator and the plasma processing chamber to receive and transmit the modulated high frequency RF power from the modulated RF power generator to the plasma processing chamber, the match network being further configured to match an impedance of the modulated RF power generator to the impedance of the plasma processing chamber.

10. The apparatus as recited in claim 9, wherein modulated RF power generator generates the modulated high frequency RF power that is adapted to produce a specified etch rate on the wafer for an anisotropic etching.

11. The apparatus as recited in claim 10, wherein the modulated high frequency RF power from the modulated RF power generator includes an average RF power and a peak RF power.

12. The apparatus as recited in claim 11, wherein the plasma processing chamber maintains a constant plasma density in response to the average RF power of the modulated high frequency RF power.

13. The apparatus as recited in claim 12, wherein the peak RF power is adapted to increase the ion bombardment energy in the plasma processing chamber for isotropic processing of the wafer.

14. The apparatus as recited in claim 13, wherein the modulated RF power generator generates the modulated high frequency RF power that includes a modulation frequency adapted to decouple the etch rate from the ion bombardment energy.

15. The apparatus as recited in claim 14, wherein the modulation frequency of the modulated high frequency RF power is greater than the time for an ion to travel from a center region of the plasma to one of the electrodes.

16. The apparatus as recited in claim 9, wherein the frequency of the modulated RF power is greater than 4 MHz.

* * * * *